United States Patent
Asakawa et al.

(10) Patent No.: US 7,050,520 B2
(45) Date of Patent: May 23, 2006

(54) PLL (PHASE-LOCKED LOOP) CIRCUIT

(75) Inventors: Hideyuki Asakawa, Tokyo (JP);
Yoshimasa Endou, Miyagi (JP)

(73) Assignee: NEC Corporation, Tokyo (JP)

( * ) Notice: Subject to any disclaimer, the term of this patent is extended or adjusted under 35 U.S.C. 154(b) by 782 days.

(21) Appl. No.: 10/152,851

(22) Filed: May 23, 2002

(65) Prior Publication Data

US 2002/0181640 A1  Dec. 5, 2002

(30) Foreign Application Priority Data

May 30, 2001 (JP) ............................. 2001-163332

(51) Int. Cl.
*H04L 7/00* (2006.01)
(52) U.S. Cl. ........................ 375/355; 375/226
(58) Field of Classification Search ................ 375/355;
455/180.3
See application file for complete search history.

(56) References Cited

U.S. PATENT DOCUMENTS 6,188,740 B1 * 2/2001 Tomaru ....................... 375/376
2002/0163391 A1 * 11/2002 Peterzell ...................... 331/25

FOREIGN PATENT DOCUMENTS

| JP | 2-180429 | 7/1990 |
| JP | 2000-68824 | 3/2000 |

* cited by examiner

*Primary Examiner*—Stephen Chin
*Assistant Examiner*—Nasrin Hoque
(74) *Attorney, Agent, or Firm*—Dickstein, Shapiro, Morin & Oshinsky, LLP.

(57) ABSTRACT

If a phase difference between a synchronizing source signal F1 and a comparison signal F2 is higher than a first lower limit a or lower than a first upper limit b, a comparator 3 selects this phase difference, if the phase difference is not higher than the lower limit a, selects the lower limit a, and if the phase difference is not lower than the upper limit b, selects the upper limit b, and a divider 7A outputs a comparison signal F2 obtained by dividing a frequency of an output signal F0, to change a phase of the signal F2 so that if the phase difference is not higher than a second lower limit e lower than the lower limit a, the phase difference may become the lower limit a and, if the phase difference is higher than a second upper limit f higher than the upper limit b, the phase difference may become the upper limit b.

12 Claims, 3 Drawing Sheets

PLL (PHASE-LOCKED LOOP) CIRCUIT

BACKGROUND OF THE INVENTION

1. Field of the Invention

The present invention relates to a PLL (Phase-Locked Loop) circuit having a frequency limiting function.

2. Description of the Related Art

FIG. 4 shows a block diagram a configuration of conventional PLL circuit having a frequency limiting function, and FIG. 5 shows a relation between phase difference detected by phase comparator and output frequency of voltage control oscillator (VCO). As shown in FIG. 4, a phase comparator (PC) 1 compares a phase of a synchronizing-source reference clock (REFCLK) signal F21 and a phase of a signal F22 to each other to then output a phase difference signal P20 indicating a phase difference between these signals F21 and F22. A phase watcher (P-WATCH) 2 activates only a signal S21 if the phase difference indicated by the phase difference signal P20 is not higher than a value a shown in FIG. 5 and activates only a signal S22 if that phase difference is a value b or higher.

A SEL 3 receives the incoming phase difference signal P20, a signal indicating the phase difference a, and a signal indicating the phase difference b. The SEL 3 selects the phase difference signal P20 input from the PC 1 to output it as the difference signal P21 if neither of the signals S21 and S22 is active. On the other hand, if the signal S21 is active, the SEL 3 selects the signal indicating the phase difference a to output it as the phase difference signal P21 and, if the signal S22 is active, selects the signal indicating the phase difference b to output it as the phase difference signal P21.

A P-VCONV 4 converts the phase difference signal P21 output from the SEL 3 into a VCO control voltage signal V21. An LPF 5 integrates the VCO control voltage signal V21 output from the P-VCONV 4 to convert it into a VCO frequency-controlled voltage signal V22. A VCO 6 outputs a VCO output clock (VCOCLK) signal F20 having a frequency proportional to a control voltage indicated by the VCO frequency-controlled voltage signal V22. A CTR 7 outputs a signal F22 obtained by dividing the frequency of the VCOCLK signal F20. Thus, in the conventional PLL circuit, the frequency of the VCOCLK signal F20 is limited in a range between a predetermined upper limit c and a predetermined lower limit d, both inclusive.

In the conventional PLL circuit, however, if the REFCLK signal F21 is input which has a frequency outside the synchronization-enabled range (that is, a frequency higher than the value c or lower than the value d in FIG. 5), a phase slip occurs in that the phase difference (indicated by the phase difference signal P20) between the signals F21 and F22 rapidly changes from the value e to the value f or vice versa, thus resulting in a problem of such periodical changing of the VCO output frequency as shown in FIG. 6.

SUMMARY OF THE INVENTION

In view of the above, it is an object of the present invention to provide a PLL circuit that can fix the frequency of an output signal to an arbitrary upper or lower limit even if the frequency of a synchronizing source signal goes out of the synchronization-enabled range.

In order to achieve above-mentioned object, a PLL circuit according to present invention comprising: a phase comparator (1) for detecting a phase difference between a synchronizing source signal and a comparison signal; a selector (3) for, if the detected phase difference is higher than a first lower limit (a), selecting the detected phase difference and, if the phase difference is not higher than the first lower limit, selecting the first limit; a phase difference/VCO control voltage converter (4) for converting the phase difference selected by the selector into a voltage; a loop filter (5) for integrating the voltage output from the phase difference/VCO control voltage converter to then output the control voltage thus obtained; a voltage-controlled oscillator (VCO) (6) for outputting an output clock signal having a frequency which is proportional to the control voltage; and a divider (7A) for outputting to the phase comparator the comparison signal obtained by dividing a frequency of the output clock signal, to change a phase of the comparison signal so that if the detected phase difference is not higher than a second lower limit (e) lower than the first lower limit, the detected phase difference may become the first lower limit.

Moreover, a PLL circuit according to present invention comprising: a phase comparator (1) for detecting a phase difference between a synchronizing source signal and a comparison signal; a selector (3) for, if the detected phase difference is lower than a first upper limit (b), selecting the detected phase difference and, if the phase difference is not lower than the first lower limit, selecting the upper limit; a phase difference/VCO control voltage converter (4) for converting the phase difference selected by the selector into a voltage; a loop filter (5) for integrating the voltage output from the phase difference/VCO control voltage converter to then output the control voltage thus obtained; a voltage-controlled oscillator (VCO) (6) for outputting an output clock signal having a frequency which is proportional to the control voltage; and a divider (7A) for outputting to the phase comparator the comparison signal obtained by dividing a frequency of the output clock signal, to change a phase of the comparison signal so that if the detected phase difference is not lower than a second upper limit (f) higher than the first upper limit, the detected phase difference may become the first upper limit.

DESCRIPTION OF THE PREFERRED EMBODIMENTS

Figure 1:
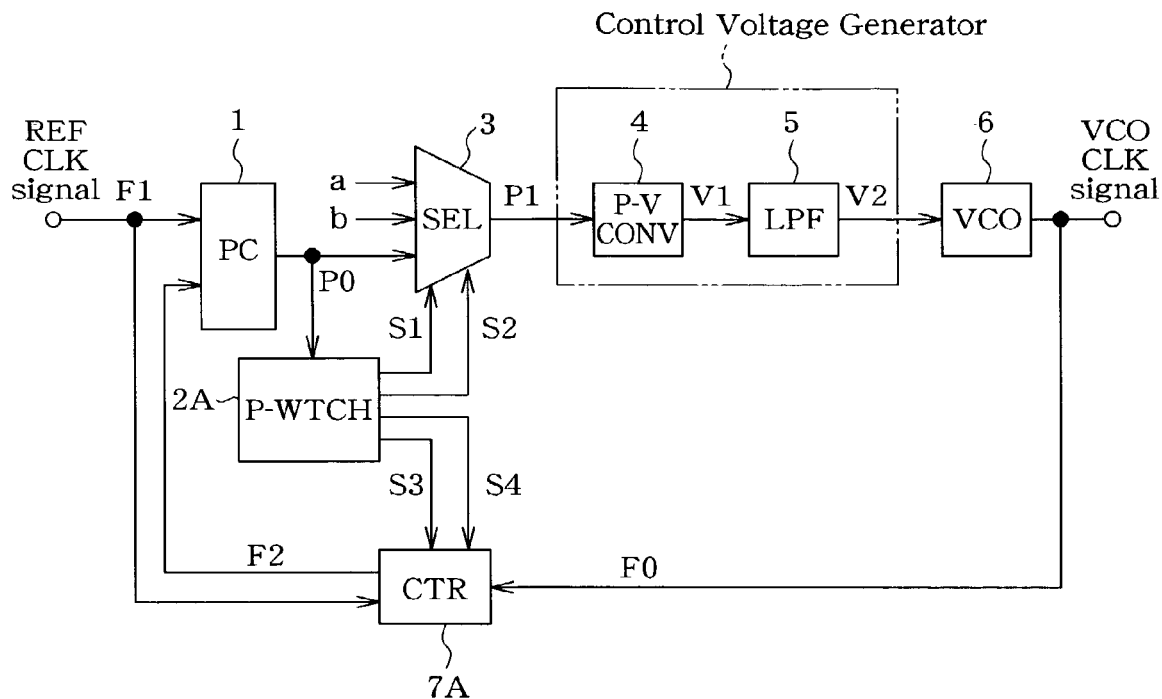
FIG. 1 is a block diagram for showing a configuration of a PLL circuit according to an embodiment of the present invention.

The following will describe in details preferred embodiments of the present invention with reference to the drawings. FIG. 1 is a block diagram for showing a configuration of a PLL circuit according to an embodiment of the present invention. A PLL circuit shown in FIG. 1 comprises a phase comparator (PC) 1, a phase watcher (P-WTCH) 2A, a selector (SEL) 3, phase-difference/VCO control voltage converter (P-VCONV) 4 as a control voltage generator, a loop filter (LPF) 5, a Voltage-Controlled Oscillator (VCO) 6, and a divider (CTR) 7A as a comparison signal generator.

In the configuration of the present embodiment, the important components are the P-WTCH 2A for watching a phase difference detected by the PC 1 in a total of four different phases to thereby output signals S1, S2, S3, and S4 indicating the watching results, the SEL 3 for responding to the signals S1 and S2 output from the P-WTCH 2A to output a phase difference detected by the PC 1 and a predetermined phase difference a or b, whichever selected thereby, and the CTR 7A for responding to the signals S3 and S4 output from the P-WTCH 2A to control the phase of a signal obtained by dividing the frequency of an output clock signal.

This configuration is employed to thereby implement a PLL circuit that has a limiting function to limit an output frequency to a predetermined upper limit c or lower, or a predetermined lower limit or higher and also that can surely shift from a frequency limiting control state to a synchronized state even if a phase-modulated signal, for example a jitter, is applied to a synchronizing source signal.

Figure 2:
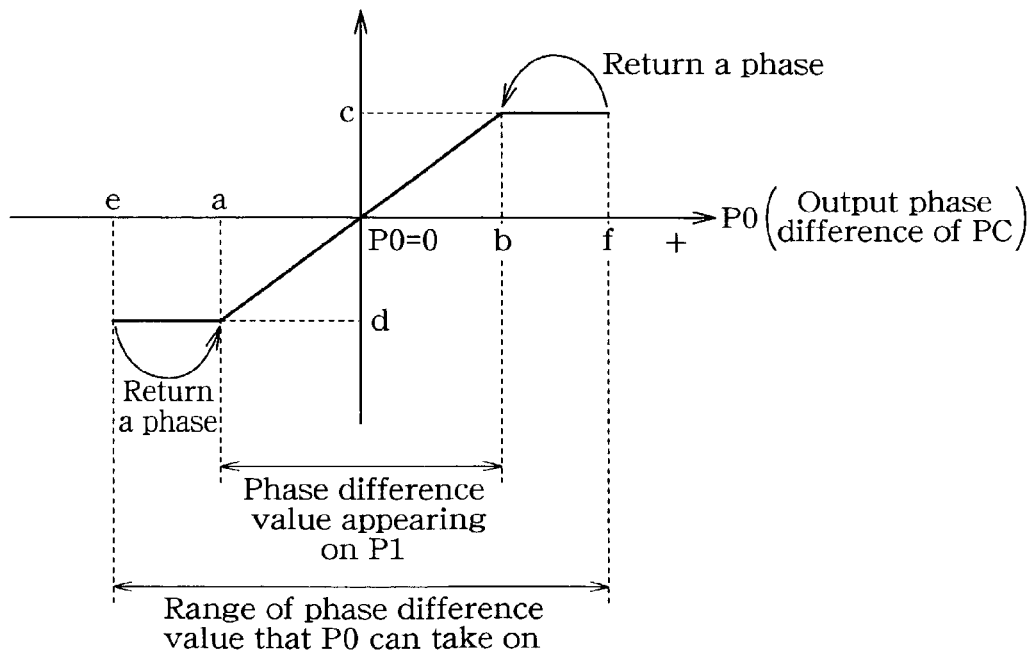
FIG. 2 is a graph for showing a relationship between a phase difference detected by a phase comparator and an output frequency of a Voltage-Controlled Oscillator (VCO) in the embodiment of the present invention.

The following will describe the operations of the PLL circuit of the present embodiment with reference to FIG. 2. FIG. 2 is a graph for showing a relationship between a phase difference detected by a phase comparator PC 1 and an output frequency of a voltage-controlled oscillator (VCO) 6 in the embodiment of the present invention. As shown in FIG. 2, to the PC 1 are input a reference clock (REFCLK) signal F1, which serves as the synchronizing source signal from an external device, and also, from the CTR 7A, a signal F2 obtained by dividing the frequency of an output clock (VCOCLK) signal F0 of the VCO. Then, the PC 1 compares the REFCLK signal F1 and the signal F2 to each other in phase to thereby output a phase difference signal P0 indicating a phase difference between the signals F1 and F2.

If the phase difference indicated by the phase difference signal P0 is the value a or lower in FIG. 2, the P-WTCH 2A activates only the signal S1 and, if the phase difference is a value e or lower in the figure, deactivates the signals S2 and S4 and activates the signals S1 and S3. Also, if the phase difference indicated by the phase difference signal P0 is the value b or higher in FIG. 2, the P-WTCH 2A activates only the signal S2 and, if it is a value f or higher in the figure, deactivates the signals S1 and S3 and activates the signals S2 and S4.

To the SEL 3 are input the phase difference signal P0, a signal indicating the phase difference a, and a signal indicating the phase difference b. If neither of the signals S1 and S2 is active, the SEL 3 selects the phase difference signal P0 input from the PC1 to output it as a phase difference signal P1. On the other hand, if the signal S1 is active, the SEL 3 selects the signal indicating the phase difference a to output it as the phase difference signal P1 and, if the S2 signal is active, selects the signal indicating the phase difference b to output it as the phase difference signal P1.

The phase difference signal P1 output from the SEL 3 is converted into a VCO control voltage signal V1 at the P-VCONV 4. The VCO control voltage signal V1 output from the P-VCONV 4 is integrated and converted into a VCO frequency-controlled voltage signal V2 at the LPF 5, which is a loop filter for determining the response characteristics of the PLL circuit. The VCO 6 outputs the VCO-CLK signal F0 having a frequency proportional to a control voltage indicated by the VCO frequency-controlled voltage signal V2.

When neither of the signals S3 and S4 is active, the CTR 7A is in a free-running state, where the CTR is out of control, so that it outputs the signal F2 obtained by dividing the frequency of the clock signal F0. When the signal S3 is active, the CTR 7 changes the phase of the signal F2 so that the phase difference (phase difference signal P0) between the signals F1 and F2 may become the phase difference a. By this phase control, the phase difference between the signals F1 and F2 changes from the value e to the value a as shown in FIG. 2, so that the P-WTCH 2A deactivates the signal S3 and activates only the signal S1. The CTR 7A, therefore, returns to the free-running state. In this state, the phase difference (phase difference signal P0) between the signals F1 and F2 is the value a, so that the output frequency F0 of the VCO6 is kept at a constant frequency d.

When the signal S4 is active, on the other hand, the CTR 7 changes the phase of the signal F2 so that the phase difference (phase difference signal P0) between the signals F1 and F2 may become the phase difference b. By this phase control, the phase difference between the signals F1 and F2 changes from the value f to the value b as shown in FIG. 2, so that the P-WTCH 2A deactivates the signal S4 and activates only the signal S2. The CTR 7A, therefore, returns to the free-running state. In this state, the phase difference (phase difference signal P0) between the signals F1 and F2 is the value b, so that the output frequency F0 of the VCO6 is kept at a constant frequency c.

Figure 3:
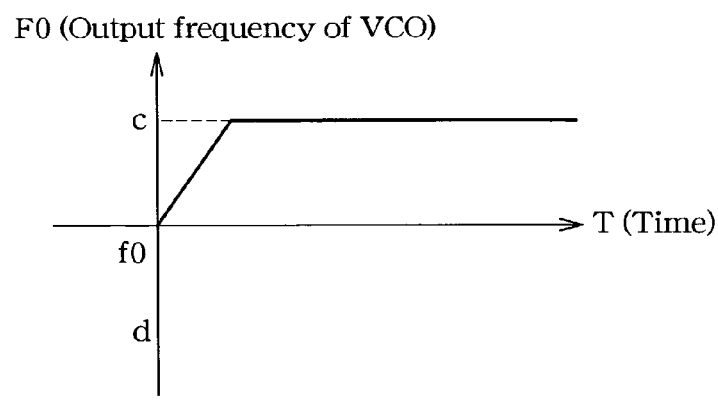
FIG. 3 is a graph for showing an output frequency of the VCO in a case where a frequency of a synchronization-source signal goes out of a synchronization-enabled frequency range of the PLL circuit of FIG. 1.
Figure 4:
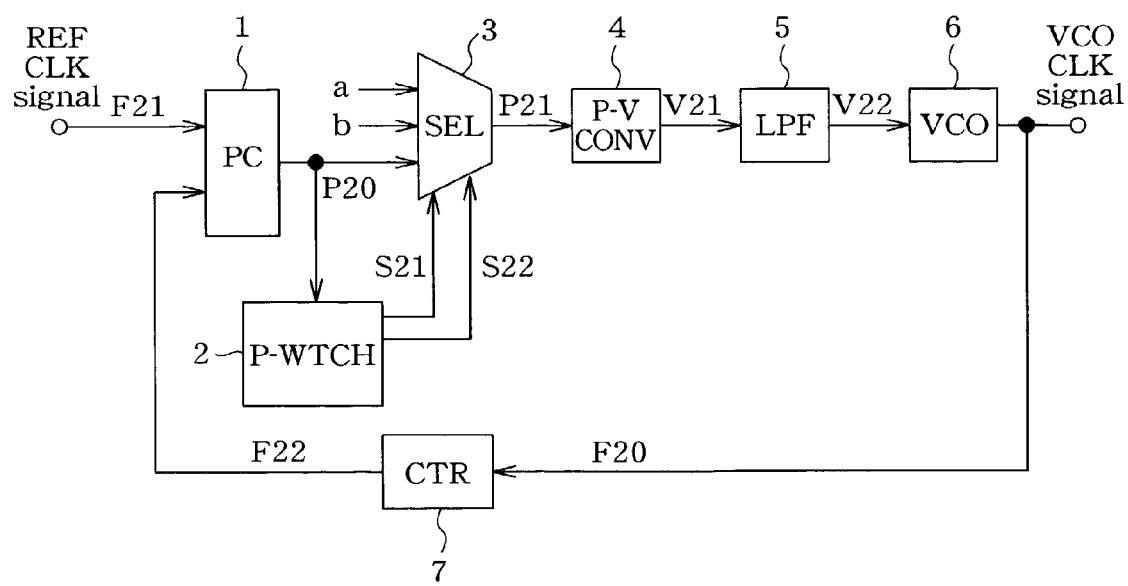
FIG. 4 is a block diagram for showing a configuration of a conventional PLL circuit having a frequency limiting function.
Figure 5:
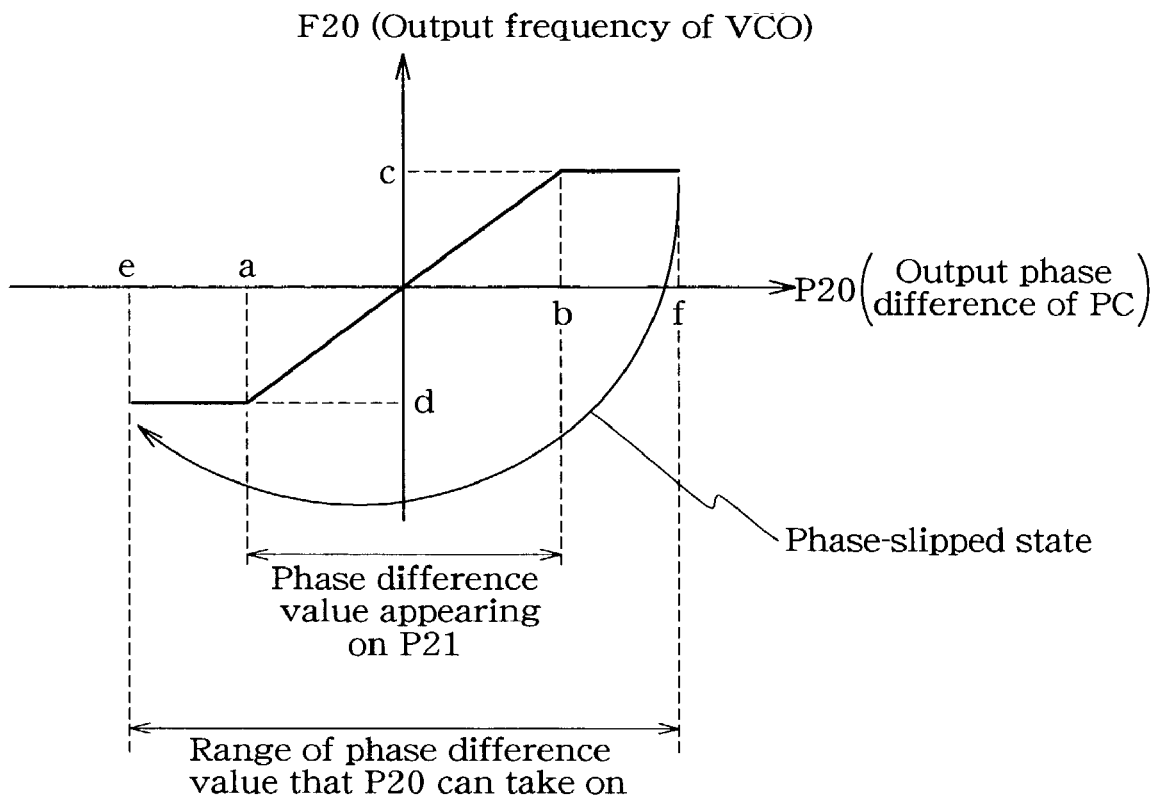
FIG. 5 is a graph for showing a relationship between a phase difference detected by a phase comparator and an output frequency of a VCO in the PLL circuit of FIG. 4.
Figure 6:
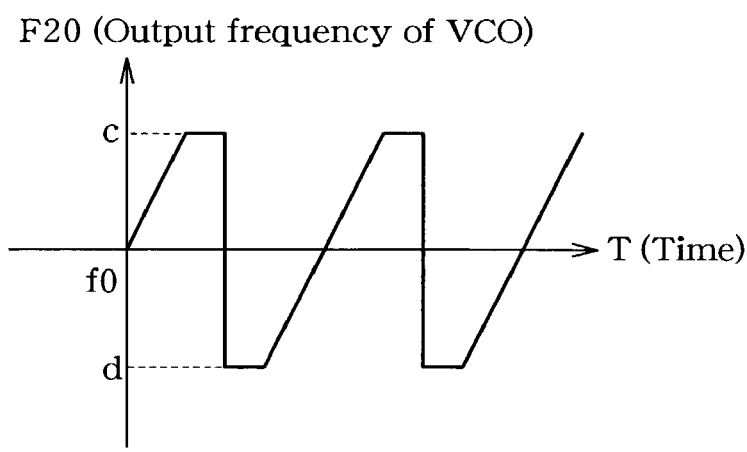
FIG. 6 is a graph for showing an output frequency of the VCO in a case where the frequency of the synchronization-source signal goes out of the synchronization-enabled frequency range of the PLL circuit of FIG. 4.

As shown in FIG. 3, if the frequency of the REFCLK signal F1 goes out of the synchronization-enabled frequency range, the frequency of the VCOCLK signal F0 is fixed at the value c (or d).

The following will consider the operations in a case where a phase modulated signal such as a jitter is added to the REFCLK signal F1 to cause the phase difference indicated by the phase difference signal P) to become the value e of f. Even when the REFCLK signal F1 with a phase-modulated amount of less than (a–e) or less than (f–b) is input to cause the phase difference (phase difference signal P0) between the signals F1 and F2 to become the value e or f, this phase difference is returned to the value a or b respectively by control of the CTR 7A.

Since, in this case, the phase-modulated amount of the REFCLK signal F1 is lower than (a–e) or (f–b), the CTR7 always returns to the fee-running state, where the CTR 7A does not provide control for returning the phase difference (P0) to the value a or b respectively. The CTR 7A, therefore, does not continue this control of returning the phase difference to the value a or b, so that despite a change of the average frequency of the REFCLK signal F1 into a range of the values between c and d, the PLL circuit is released from a phenomenon of pulling in the frequency and thus can synchronize with the REFCLK signal F1. Note here that the phase differences a, b, e, and f and the VCO output frequencies c and d may take on an arbitrary value that can be designed.

According to the present invention, by providing a frequency divider for outputting a comparison signal obtained by dividing the frequency of an output clock signal to output it to a phase comparator so that if a phase difference detected by this phase comparator is not higher than a second lower limit lower than a first lower limit, the phase of the comparison signal may be changed so as to cause this detected phase difference to become the first lower limit (or that if the phase difference detected by the phase comparator is not lower than a second upper limit higher than a first upper limit, the phase of the comparison signal may be changed so as to cause the detected phase difference to become the first upper limit), if the frequency of a synchronizing source signal goes out of a range in which a PLL circuit is capable of synchronization, limit control can be provided for fixing the frequency of the output clock signal to the predetermined lower limit or upper limit, thus stabilizing the output clock signal. Also, when the frequency of the synchronizing source signal input to the PLL circuit, even if phase-modulated by, for example a jitter, has shifted into the synchronization-enabled frequency range of the PLL circuit, the limit controlled state can escaped so that the synchronizing source signal may be followed, thus making the PLL circuit tolerable against a jitter which may occur on the synchronizing source signal (that is, capable of synchronizing with it).

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and rage of equivalency of the claims are therefore intended to be embraced therein.

The entire disclosure of Japanese Patent Application No. 2001-163332 (Filed on May 30, 2001) including specification, claims, drawings and summary are incorporated herein by reference in its entirety.

What is claimed is:

1. A Phase locked loop (PLL) circuit comprising:
   a phase comparator for detecting a phase difference between a synchronizing source signal and a comparison signal;
   a selector for, when the detected phase difference is higher than a first lower limit, selecting the detected phase difference and, when the phase difference is not higher than the first lower limit, selecting the first lower limit;
   a control voltage generator for generating a control voltage based on the phase difference selected by the selector;
   a voltage-controlled oscillator (VCO) for outputting an output clock signal having a frequency which is proportional to the control voltage; and
   a comparison signal generator for outputting to the phase comparator the comparison signal based on the output clock signal, to change a phase of the comparison signal so that when the detected phase difference is not higher than a second lower limit lower than the first lower limit, the detected phase difference will become the first lower limit.

2. A PLL circuit comprising:
   a phase comparator for detecting a phase difference between a synchronizing source signal and a comparison signal;
   a selector for, when the detected phase difference is lower than a first upper limit, selecting the detected phase difference and, when the phase difference is not lower than the first lower limit, selecting the upper limit;
   a control voltage generator for generating a control voltage based on the phase difference selected by the selector;
   a voltage-controlled oscillator (VCO) for outputting an output clock signal having a frequency which is proportional to the control voltage; and
   a comparison signal generator for outputting to the phase comparator the comparison signal based on the output clock signal, to change a phase of the comparison signal so that when the detected phase difference is not lower than a second upper limit higher than the first upper limit, the detected phase difference will become the first upper limit.

3. A PLL circuit comprising:
   a phase comparator for detecting a phase difference between a synchronizing source signal and a comparison signal;
   a selector for, when the detected phase difference is higher than a first lower limit and lower than a first upper limit, selecting the detecting phase difference and, if the phase difference is not higher than the first lower limit, selecting the first lower limit and, when the phase difference is not lower than the first upper limit, selecting the first upper limit;
   a control voltage generator for generating a control voltage based on the phase difference selected by the selector;
   a voltage-controlled oscillator (VCO) for outputting an output clock signal having a frequency which is proportional to the control voltage; and
   a comparison signal generator for outputting to the phase comparator the comparison signal based on the output clock signal, to change a phase of the comparison signal so that when the detected phase difference is not higher than a second lower limit lower than the first lower limit, the detected phase difference may become the first lower limit and, when the detected phase difference is not lower than a second upper limit higher than the first upper limit, the detected phase difference will become the first upper limit.

4. A PLL circuit according to claim 1, wherein the control voltage generator comprising:
   a phase difference/VCO control voltage converter for converting the phase difference selected by said selector into a voltage,
   a loop filter for integrating the voltage output from the phase difference/VCO control voltage converter to then output the control voltage thus obtained.

5. A PLL circuit according to claim 2, wherein the control voltage generator comprising:
   a phase difference/VCO control voltage converter for converting the phase difference selected by said selector into a voltage,
   a loop filter for integrating the voltage output from the phase difference/VCO control voltage converter to then output the control voltage thus obtained.

6. A PLL circuit according to claim 3, wherein the control voltage generator comprising:
   a phase difference/VCO control voltage converter for converting the phase difference selected by said selector into a voltage,
   a loop filter for integrating the voltage output from the phase difference/VCO control voltage converter to then output the control voltage thus obtained.

7. A PLL circuit according to claim 1, wherein the comparison signal generator is a divider for outputting to the phase comparator the comparison signal obtained by dividing a frequency of said output clock signal.

8. A PLL circuit according to claim 2, wherein the comparison signal generator is a divider for outputting to the phase comparator the comparison signal obtained by dividing a frequency of said output clock signal.

9. A PLL circuit according to claim 3, wherein the comparison signal generator is a divider for outputting to the phase comparator the comparison signal obtained by dividing a frequency of said output clock signal.

10. A PLL circuit according to claim 4, wherein the comparison signal generator is a divider for outputting to the phase comparator the comparison signal obtained by dividing a frequency of said output clock signal.

11. A PLL circuit according to claim 5, wherein the comparison signal generator is a divider for outputting to the phase comparator the comparison signal obtained by dividing a frequency of said output clock signal.

12. A PLL circuit according to claim 6, wherein the comparison signal generator is a divider for outputting to the phase comparator the comparison signal obtained by dividing a frequency of said output clock signal.

* * * * *